Jan. 5, 1965 G. K. HOUPT 3,164,783
AMPLITUDE CONTROLLED OSCILLATOR
Filed Sept. 5, 1961
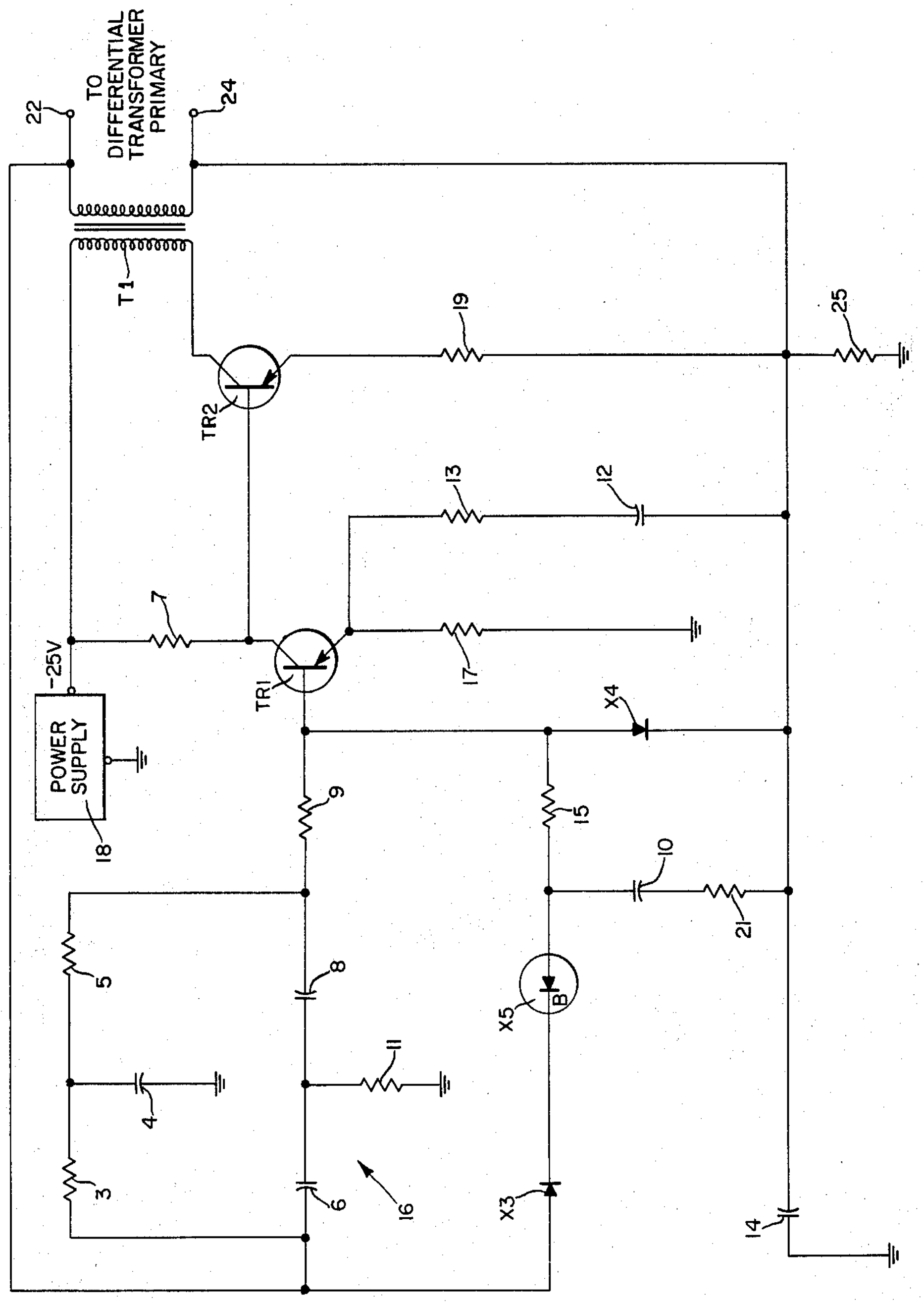
INVENTOR.
GROVER K. HOUPT
BY
Nelson E. Kimmelman
ATTORNEY United States Patent Office 3,164,783
Patented Jan. 5, 1965

3,164,783
AMPLITUDE CONTROLLED OSCILLATOR
Grover K. Houpt, Lansdale, Pa., assignor to Automatic Timing & Controls, Inc., King of Prussia, Pa., a corporation of Pennsylvania
Filed Sept. 5, 1961, Ser. No. 136,709
6 Claims. (Cl. 331—109)

This invention relates to oscillators and in particular to oscillators for producing constant amplitude output signals.

It is often desired to provide oscillators whose output signal is characterized by constant amplitude and low distortion. While there are many kinds of oscillators, many of them are subject to changes in output signal amplitude and wave-form distortion because one or more parameters of the circuit change. For example, changes in bias voltages furnished by the power supply are known to cause undesired wave-form distortion and amplitude changes in the output of a transistorized oscillator.

It is therefore a primary object of the present invention to provide an oscillator whose output signal is characterized by constant amplitude and wave-form purity.

Still another object of the invention is to provide an oscillator whose output signal is substantially unaffected in amplitude or wave-form by changes in the operating parameters of the circuit.

Still another object of the invention is to provide an improved oscillator using negative feedback to assist in keeping the output signal amplitude and wave-form substantially independent of changes in power supply voltages.

Still other objects of the invention will be apparent to those skilled in the art upon perusal of the drawing, specification and claims herein.

In accordance with my invention I provide a two stage, direct-coupled amplifier, the output of the second stage being transformer-coupled to the input of the first stage via a parallel-T frequency-determining and polarity-reversing network. In addition, I provide means for controlling the overall gain of the amplifiers which is responsive to the amplitude of the oscillatory signal. This controlling means includes a negative feedback path through a voltage-regulating device, and a long time-constant circuit, and a unidirectional current conducting device connected to the input of the first stage. When the amplitude of the positive-going half-cycles of the output signal exceeds a certain voltage, the time-constant circuit charges up to reduce the amplitude of the oscillatory signal applied from the parallel-T network to the input of the first stage and acts to divert it to the unidirectional device. Thus there is less amplification by both stages and hence the amplitude of the oscillatory signal tends to be maintained constant.

The sole figure is a schematic representation of one form that my invention may take.

Referring to the sole figure, two transistors TR1 and TR2, both in the common emitter configuration, are shown directly coupled to one another from the collector of TR1 to the base of TR2. TR1 may be a type 2N1381 for example whereas TR2 may be a 2N251 for example. The collector of TR2 is in series with the primary winding of transformer T1 which is also coupled to the —25 volt terminal of a power supply 18 for bias purposes. The collector of TR1 is also coupled, via resistance 7, to the same terminal, for bias purposes. The secondary winding of T1 is coupled to output terminals 22 and 24 to which the utilization circuit involved may be attached. For example, the output may be a 1600 c.p.s. signal applied to the primary winding of a differential transformer and also as a reference signal to a synchronous demodulator.

The high side of the secondary of T1, which is connected to output terminal 22, is also connected via a frequency-determining, parallel-T network 16 and via a resistance 9 to the base of TR1. This path feeds the amplified output signal, which is opposite in polarity to the input signal, to TR1. The circuit 16 determines the frequency of oscillation and also inverts the output signal so that it appears as a positive A.C. feedback signal at the base of TR1. Frequencies of signals outside this band are not inverted and hence the feedback is negative for these frequencies. This reduces distortion because harmonics are attenuated rather than amplified. The circuit 16 consists of resistances 3 and 5 in series, capacitance elements 6 and 8 in series, resistance 11 connected between the common junction of capacitances 6 and 8 to ground, and capacitance element 4 connected between the junction of resistances 3 and 5 and ground.

To insure that the amplitude of the output signal is maintained substantially constant, there is also connected to the negative A.C. feedback path a diode X3 in series with a Zener diode X5. To the Zener diode there is connected a long time-constant circuit consisting of a large value capacitor 10 in series with the resistance element 21, the resistance 15, and the diode X4, the latter being connected to the resistance 15 and the base of TR1 as well as to the grounding capacitance 14. The negative feedback signal will cause the diode X3 to conduct only on positive half-cycles thereof. The Zener diode X5 is constructed and arranged to conduct heavily when the positive-going signal exceeds a certain level. When this happens, the capacitor 10 will begin to charge at a rate determined by the excess of peak signal voltage over the "breakdown voltage" of Zener diode X5 and also by the value of capacitor 10 and resistance 21 and the equivalent impedance of the charging circuit as determined by the various parameters of that circuit. A portion of this charge is bled off gradually through the resistor 15 and diode X4, the incremental resistance of the diode X4 being controlled by the amplitude of this current. The resistor 9 and the incremental resistance of diode X4 form a voltage divider to the signal entering the base of TR1. The more the positive-going signal is in excess of the Zener diode breakdown voltage, the greater will be the current through diode X4. Hence the resistance of diode X4 will be lower and therefore the signal entering the base of TR1 will be more attenuated. This action automatically regulates the amplitude of the oscillatory signal by controlling the overall loop gain of the circuit.

In one embodiment of my invention the values of the components of the circuit were as follows:

| *Resistors* | | *Capacitors* | |
|---|---|---|---|
| | | | Mfd. |
| 3 | 1K | 4 | 0.5 |
| 5 | 1K | 6 | 0.1 |
| 7 | 27K | 8 | 0.1 |
| 9 | 1K | 10 | 5 |
| 11 | 200 | 12 | 30 |
| 13 | 56 | 14 | 300 |
| 15 | 1K | | |
| 19 | 18 | | |
| 21 | 18 | | |
| 25 | 68 | | |
| 26 | 560 | | |

While the invention has been shown in one illustrative environment, many other applications will occur to those skilled in the art. Consequently, the scope of this invention should be limited only by the claims herein.

I claim:

1. An oscillator circuit comprising: first and second direct-coupled transistors, a frequency determining and signal polarity-reversing means constructed and arranged to feed the output signal of said second transistor in opposite polarity back to the input of said first transformer coupled between the output of said second transistor, said means for feeding back including a transistor and said polarity-reversing means, and means including means continuously responsive to principally the positive half-cycles of said output signal for diverting selected amounts of said feedback signal from the input of said first transistor, said diverting means including D.C. developing means responsive to selected amplitude and polarity portions of said second transistor output signal.

2. An oscillator circuit comprising: first and second solid-state amplifying means, the output of the first being coupled to the input of a second, a signal-conducting path coupled between the output circuit of said second amplifying means and the input of said first amplifying means, said path including only passive electrical components which reverse the polarity of the bidirectional signal at said output of said second amplifying means and apply it to the input of said first amplifying means for sustaining oscillation of said first and second means, and means including means continuously responsive to selected amplitude portions of said output signal of said second means for diverting selected amounts of said oscillation-sustaining signal from being applied to the input of said first amplifying means.

3. The oscillator according to claim 2 wherein said diverting means includes a unidirectional current carrying device which is constructed and arranged to ground said diverted amounts of said feedback signal.

4. An oscillator circuit comprising first and second transistors, the output circuit of said first transistor being coupled to the input circuit of said second transistor, transformer means coupled to the output of said second transistor and to output terminals of said oscillator circuit, a polarity-reversing circuit coupled to said output terminals and to the input of said first transistor, said polarity-reversing circuit being constructed to feedback to the input of said first transistor a signal which is opposite in polarity to the signal in the output circuit of said second transistor thereby to enable oscillation to occur, said polarity-reversing circuit also acting to determine the frequency of said oscillations, and means coupled to the output circuit of said second transistor and to the input circuit of said first transistor for tending to maintain the envelope of the signal at said output terminals relatively constant, said maintaining circuit comprising a first unidirectional current carrying means adapted to conduct only in response to selected half-cycles of said output signal, a time-constant circuit coupled to the input of said first transistor and having a time-constant which is relatively long compared to the period of the oscillatory signal at said output terminals, and means coupled between said unidirectional current device and said time-constant circuit for charging the latter only in response to selected amplitude portions of the signal passed by said undirectional device, said time-constant circuit thereupon tending to inhibit the application to said first transistor of said oscillatory signal from said polarity-reversing circuit so that the overall gain of said first and second amplifiers is diminished.

5. The oscillator according to claim 4 wherein said time-constant circuit comprises a unidirectional current-carrying device constructed and arranged to divert said oscillatory current from being applied to said input of said first transistor.

6. A constant-amplitude oscillatory circuit comprising: first and second direct-coupled transistors in the common-emitter configuration, a transformer whose primary winding is coupled to the collector of said second transistor and to a source of bias voltage, a parallel-T network coupled to the secondary of said transformer and to the base of said first transistor, said parallel-T network being constructed and arranged to apply to said base the signal appearing in said transformer secondary but in opposite polarity thereto, a unidirectional current conducting device coupled to said secondary and arranged to conduct only when the signal in said secondary is positive, a Zener diode in series with said unidirectional device and constructed and arranged to conduct only when the amplitude of said positive signal exceeds a selected level, and an RC circuit coupled to said Zener diode, said RC circuit having a time-constant which is relatively long compared with the period of oscillations of the signal in said secondary, said RC circuit being coupled to the base of said first transistor and being arranged to be charged positive when said signal exceeds said selected amplitude, said RC circuit also including a second unidirectional current conducting device coupled to the base of said first transistor, said second device being constructed and arranged to be rendered more conductive when said RC circuit is charged positive whereupon said second device diverts said oscillatory current from said parallel-T network from being applied to the base of said first transistor.

References Cited by the Examiner

UNITED STATES PATENTS

| | | | |
|---|---|---|---|
| 2,764,643 | 9/56 | Sulzer | 331—109 |
| 2,825,811 | 3/58 | Cooper | 331—183 |
| 2,941,160 | 6/60 | Blake et al. | 331—183 |
| 2,980,865 | 4/61 | Hilbourne | 331—109 |
| 2,997,664 | 8/61 | Jensen | 331—109 |

OTHER REFERENCES

Proc. I.R.E., February 1954, vol. 42, pages 391–401, "An Amplitude Stabilized Transistor Oscillator," Kretzmer. 331—109.

ROY LAKE, *Primary Examiner.*

UNITED STATES PATENT OFFICE
CERTIFICATE OF CORRECTION

Patent No. 3,164,783 January 5, 1965

Grover K. Houpt

It is hereby certified that error appears in the above numbered patent requiring correction and that the said Letters Patent should read as corrected below.

Column 3, lines 4 and 5, for "transformer coupled between the output of said second transistor, said means for feeding back including a" read -- transistor, said means for feeding back including a transformer coupled between the output of said second --.

Signed and sealed this 19th day of April 1966.

(SEAL)
Attest:

ERNEST W. SWIDER
Attesting Officer

EDWARD J. BRENNER
Commissioner of Patents